(12) United States Patent
Lee et al.

(10) Patent No.: US 7,005,674 B2
(45) Date of Patent: Feb. 28, 2006

(54) ORGANIC THIN FILM TRANSISTOR COMPRISING MULTI-LAYERED GATE INSULATOR

(75) Inventors: Sang Yoon Lee, Seoul (KR); Jong Jin Park, Gyeonggi-Do (KR); Yi Yeol Lyu, Daejeon-Si (KR); Young Hun Byun, Daejeon-Si (JP); Bon Won Koo, Gyeonggi-Do (KR); In Nam Kang, Gyeonggi-Do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 43 days.

(21) Appl. No.: 10/769,816

(22) Filed: Feb. 3, 2004

(65) Prior Publication Data

US 2005/0001210 A1 Jan. 6, 2005

(30) Foreign Application Priority Data

Jul. 3, 2003 (KR) ...................... 10-2003-0044799

(51) Int. Cl.
*H01L 35/24* (2006.01)
*H01L 29/76* (2006.01)

(52) U.S. Cl. .................... 257/40; 257/411; 438/99; 438/287

(58) Field of Classification Search .................. 257/40, 257/288, 289, 411; 438/99, 151, 158, 287
See application file for complete search history.

(56) References Cited

U.S. PATENT DOCUMENTS

| | | | |
|---|---|---|---|
| 5,981,970 | A | 11/1999 | Dimitrakopoulos et al. |
| 6,232,157 | B1 | 5/2001 | Dodabalapur et al. |
| 6,558,987 | B1 | 5/2003 | Lee |
| 6,563,174 | B1 | 5/2003 | Kawasaki et al. |
| 6,617,609 | B1 * | 9/2003 | Kelley et al. .................. 257/40 |
| 6,768,132 | B1 * | 7/2004 | Smith et al. .................. 257/40 |

OTHER PUBLICATIONS

C. D. Dimitrakopoulos et al.; Low-Voltage Organic Transistors on Plastic Comprising High-Dielectric Constant Gate Insulators; Report; Feb. 5, 1999; pp. 822-824; vol. 283; Science, USA.

Y. Y. Lin et al.; High-Mobility Pentacene Organic Thin Film Transistors; 54th Annual Device Research Conference Digest; 1996; pp. 80-81.

* cited by examiner

Primary Examiner—Ori Nadav
(74) Attorney, Agent, or Firm—Buchanan Ingersoll PC

(57) ABSTRACT

An organic thin film transistor (OTFT) comprising a gate electrode, a gate insulating film, an organic active layer and a source/drain electrode, or a gate electrode, a gate insulating film, a source/drain electrode and an organic active layer, sequentially formed on a substrate, wherein the gate insulating film is a multi-layered insulator comprising a first layer of a high dielectric material and a second layer of an insulating organic polymer compatible with the organic active layer, the second layer being positioned directly under the organic active layer. The OTFT of the present invention shows low threshold and driving voltages, high charge mobility, and high $I_{on}/I_{off}$, and it can be prepared by a wet process.

10 Claims, 2 Drawing Sheets

ORGANIC THIN FILM TRANSISTOR COMPRISING MULTI-LAYERED GATE INSULATOR

This non-provisional application claims priority under 35 U.S.C. §119(a) from Korean Patent Application No. 2003-44799 filed on Jul. 3, 2003, which is herein incorporated by reference.

BACKGROUND OF THE INVENTION

1. Field of the Invention

The present invention relates to organic thin film transistors, and in particular, to an organic thin film transistor including a gate electrode, a gate insulating film, an organic active layer and a source/drain electrode, or a gate electrode, a gate insulating film, a source/drain electrode and an organic active layer, sequentially formed on a substrate, wherein the gate insulating film is a multi-layered insulator comprising a first layer of a high dielectric constant (k) material and a second layer of an insulating organic polymer compatible with the organic active layer, the second layer being positioned directly under the organic active layer.

2. Description of the Related Art

In recent years, most of thin film transistors (TFT) used for display application consisted of amorphous silicon as the semiconductor, silicon oxide, or silicon nitride as the insulator, and metal electrodes. However, with the recent development of various conductive organic materials, research into developing an organic thin film transistor (OTFT) using an organic material as the semiconductor has been made actively. Since its first development in the 1980s, the OTFT has widened its application into functional electronic devices and optical devices. For example, in the field of liquid crystal displays (LCD), which includes the TFT as switching elements controlling the electric fields, there are many attempts to adopt the OTFT due to its flexibility and easy preparing process. As novel electronic material, the organic semiconductor in the OTFT is superior to its inorganic counterpart (i.e. amorphous silicon) because it has many synthetic routes and can be formed in any shape from fiber to film. Further it shows high flexibility and can be manufactured at a low cost. Therefore, the OTFT using the organic semiconductor such as conducting polymers as an active layer is considered to be advantageous in that the overall manufacture can be achieved by a roll to roll process using a plastic substrate because its active layer can be formed by a printing-process under atmospheric pressure, instead of chemical vapor deposition (CVD) using plasma and requiring high pressure and high temperature, so low-priced TFT could be realized.

But, compared with the amorphous Si TFT, the OTFT exhibits disadvantageously lower charge mobility and higher driving and threshold voltages. In this regard, N. Jackson et al. made an improvement and raised possibility for the OTFT's practical use by achieving a charge mobility of 0.6 $cm^2 \cdot V^{-1} \cdot sec^{-1}$ with pentacene active layer (54$^{th}$ Annual device Research Conference Digest 1996). However, the charge mobility achieved by N. Jackson still falls short of the required value, and as well, the OTFT in the prior art requires a driving voltage higher than 100 V and a sub-threshold voltage at least 50 times as high as that of amorphous silicon-TFT. Meanwhile, in U.S. Pat. No. 5,981,970 and Science (Vol. 283, pp822–824), there is disclosed a method of lowering the driving voltage and the threshold voltage in the OTFT by use of a high dielectric constant (i.e. high k) gate insulator, in which the gate insulator is made of an inorganic metal oxide such as $Ba_xSr_{1-x}TiO_3$ (BST; Barium Strontium Titanate), $Ta_2O_5$, $Y_2O_3$, and $TiO_2$, or a ferroelectric insulator such as $PbZr_xTi_{1-x}O_3$(PZT), $Bi_4Ti_3O_{12}$, $BaMgF_4$, $SrBi_2(Ta_{1-x}Nb_x)_2O_9$, $Ba(Zr_{1-x}Ti_x)O_3$ (BZT), $BaTiO_3$, $SrTiO_3$, and $Bi_4Ti_3O_{12}$. In the OTFT prepared by said method, the gate insulator was prepared by chemical vapor deposition, physical vapor deposition, sputtering, or sol-gel coating techniques and its dielectric constant, k, was 15 or higher. By using this high k insulator, the driving voltage can be decreased to −5V, but the charge mobility still remains unsatisfactory, lower than 0.6 $cm^2 \cdot V^{-1} \cdot sec^{-1}$. Further, since the process requires high temperatures of 200–400° C., there is a limit in selecting the type of the substrate and as well, it becomes impossible to adopt a common wet process such as simple coating or printing. U.S. Pat. No. 6,232,157 discloses a method of using polyimide, benzocyclobutene or polyacryl as the organic insulating film, but, the OTFT prepared by the method cannot exhibit device characteristics equal to those of the TFT of inorganic insulator.

In order to improve the performance of thin film electronic devices in the prior art, there were many attempts to adopt a multi-layered gate insulator having two or more layers. For example, U.S. Pat. Nos. 6,563,174 and U.S. Pat. No. 6,558,987 disclose a multi-layered gate insulating film made of amorphous silicon nitride and silicon oxide and a double insulating film made of the same material, respectively, and both of the patents reported that there was a substantial improvement in electrical property of the insulator and crystalline quality of the semiconductor layer. However, these patents are inherently related to the inorganic TFT using the inorganic material, such as amorphous or monocrystalline silicon, and thus cannot be applied in the preparation of the organic semiconductor device.

Recently, many attempts have been made to use the OTFT for various drive devices. However, to realize the practical use of OTFT in LCD or flexible displays using organic EL, not only should a charge mobility increase to the level of 5 $cm^2 \cdot V^{-1} \cdot sec^{-1}$ or higher, but also improvement in the driving and threshold voltages of the device should be achieved. In particular, for simplifying the preparation and reducing the cost, it can be desirable for the whole process of preparing the OTFT to be carried out by an all-printing or all-spin method on a plastic substrate. Under the circumstances, there have been many research efforts for developing a method to simplify the preparation of the organic gate insulating film and to increase the charge mobility in the interface between the insulator and the organic active layer. However, satisfactory results have yet to be obtained.

Thus, in this art, it is urgently demanded to develop an organic TFT of a new structure that shows high charge mobility, superior insulating properties, and low driving and threshold voltages, and that can be prepared with ease, for example, by a common wet process.

SUMMARY OF THE INVENTION

The present inventors devoted much effort to meet these demands and found that, when using a multi-layered gate insulator including a first layer of a high k material and a second layer of an insulating polymer being compatible with an organic active layer and positioned directly beneath the organic active layer, the OTFT thus obtained exhibits a higher charge mobility and a lower driving and threshold voltages and its whole preparation can be achieved by a wet process, such as printing or spin coating.

Therefore, a feature of an embodiment of the present invention is to provide an organic thin film transistor comprising a gate electrode, a gate insulating film, an organic active layer and a source/drain electrode, or a gate electrode, a gate insulating film, a source/drain electrode and an organic active layer, sequentially formed on a substrate, wherein the gate insulating film is a multi-layered insulator comprising i) a first layer of a high dielectric material and ii) a second layer of an insulating organic polymer being compatible with the organic active layer and positioned directly under the organic active layer.

DETAILED DESCRIPTION OF THE INVENTION

Figure 1:
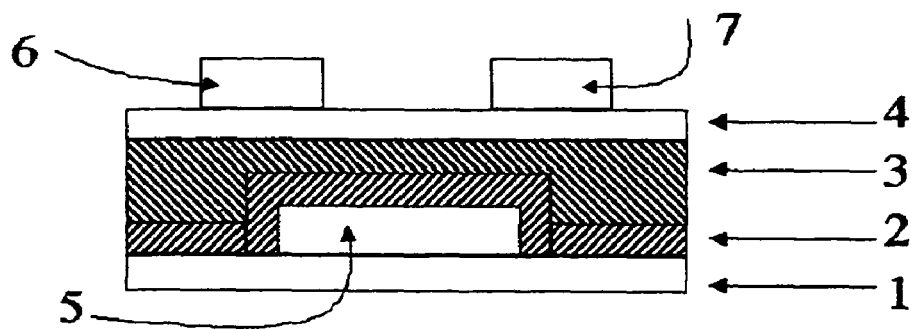
FIG. 1 is a schematic cross-sectional view of an organic thin film transistor (OTFT) according to a preferable embodiment of the present invention.

As shown in FIG. 1, an OTFT according to the present invention includes (a) a substrate 1 on which one or more gate electrode(s) is (are) disposed, (b) one or more gate electrode(s) 5, (c) a multi-layered gate insulating film disposed on the gate electrode(s) 5 comprising (i) a first insulating layer 2 of high-k material and (ii) a second insulating layer 3 of an organic polymer being compatible with and positioned directly beneath an organic active layer 4, (d) an organic semiconductor layer as the organic active layer 4 disposed on the gate insulating film, and (e) a source/drain electrode (6 and 7).

As mentioned above, the layering order between the organic active layer and the source/drain electrode may be changed relative to each other.

FIG. 1 shows schematically one preferable embodiment of the present invention so the gate insulating film of the OTFT of the present invention, consisting of two layers in FIG. 1, may have two or more layer as required. A total effective dielectric constant of the gate insulating film can be adjusted by controlling the thickness of the first insulating layer 2 and second insulating layer 3.

In the present invention, the first layer of the gate insulating film is composed of a high k material having both high dielectric constant (k) and excellent insulating properties, and it is formed by a wet process. Specifically, the first insulating layer 2 is made of (1) a mixture of an insulating organic polymer and an organic metal compound having a dielectric constant of 5 or higher, or (2) a mixture of an insulating organic polymer and nanoparticles of an inorganic metal oxide or ferroelectric insulator having a dielectric constant of 5 or more. The dielectric constant 'k' of the first layer can be adjusted by controlling a weight ratio between the organic polymer and the organic metal compound or the nanoparticles. The dielectric constant of the first insulating layer should be controlled at 5 or higher and, in the case of the dielectric constant being less than 5, an improvement of drive properties is more difficult to achieve due to the lower effective dielectric constant. For formation of the first layer, the mixture is coated on the substrate including the gate electrode by the wet process, and then baked.

The insulating organic polymer useful for preparing the first insulating layer includes most polymers exhibiting insulating properties. The examples of the insulating organic polymer include, but are not limited to, polyester, polycarbonate, polyvinylalcohol, polyvinylbutyral, polyacetal, polyarylate, polyamide, polyamidimide, polyetherimide, polyphenylenether, polyphenylenesulfide, polyethersulfone, polyetherketone, polyphthalamide, polyethernitrile, polyethersulfone, polybenzimidazole, polycarbodiimide, polysiloxane, polymethylmethacrylate, polymethacrylamide, nitrile rubbers, acryl rubbers, polyethylenetetrafluoride, epoxy resins, phenol resins, melamine resins, urea resins, polybutene, polypentene, poly(ethylene-co-propylene), poly (ethylene-co-butenediene), polybutadiene, polyisoprene, poly(ethylene-co-propylene diene), butyl rubbers, polymethylpentene, polystyrene, poly(styrene-co-butadiene), hydrogenated poly(styrene-co-butadiene), hydrogenated polyisoprene, hydrogenated polybutadiene and mixtures thereof.

The organic metal compound used for the first insulating layer is titanium-, zirconium-, hafnium- and aluminum-based organic metal compounds. Examples of the titanium-based compounds include, but are not limited to, titanium (IV) n-butoxide, titanium (IV) t-butoxide, titanium (IV) ethoxide, titanium (IV) 2-ethylhexoxide, titanium (IV) isopropoxide, titanium (IV) (di-isopropoxide)bis-(acetylacetonate), titanium (IV) oxide bis(acetylacetonate), trichlorotris (tetrahydrofuran)titanium (III), tris(2,2,6,6-tetramethyl-3,5-heptanedionato)titanium(III), (trimethyl)pentamethyl cyclopentadienyl titanium (IV), pentamethylcyclopentadienyltitanium trichloride (IV), pentamethylcyclo-pentadienyltitanium trimethoxide (IV), tetrachlorobis(cyclohexylmercapto)titanium (IV), tetrachlorobis(tetrahydrofuran) titanium (IV), tetrachlorodiamminetitanium (IV), tetrakis (diethylamino)titanium (IV), tetrakis(dimethylamino) titanium (IV), bis(t-butylcyclopentadienyl) titaniumdichloride, bis(cyclopenta dienyl) dicarbonyltitanium (II), bis(cyclopentadienyl)titanium dichloride, bis(ethylcyclopentadienyl)titanium dichloride, bis(pentamethylcyclopentadienyl)titanium dichloride, bis (isopropylcyclopentadienyl)titanium dichloride, tris(2,2,6, 6-tetramethyl-3,5-heptanedionato)oxotitanium (IV), chlorotitanium triisopropoxide, cyclopentadienyltitanium trichloride, dichlorobis(2,2,6,6-tetramethyl-3,5-heptane dionato)titanium (IV), dimethylbis(t-butylcyclopentadienyl) titanium (IV) and di(isopropoxide)bis (2,2,6,6-tetramethyl-3,5-heptanedionato)titanium (IV). Examples of the zirconium-based compounds include, but are not limited to, zirconium (IV) n-butoxide, zirconium (IV) t-butoxide, zirconium (IV) ethoxide, zirconium (IV) isopropoxide, zirconium(IV)n-propoxide, zirconium (IV) acetylacetonate, zirconium (IV) hexafluoroacetylacetonate, zirconium (IV) trifluoroacetylacetonate, tetrakis(diethylamino)zirconium, tetrakis(dimethylamino)zirconium, tetrakis(2,2,6,6-tetramethyl-3,5-heptanedionato)zirconium (IV) and zirconium (IV) sulfate tetrahydrate. Examples of the hafnium-based compounds include, but are not limited to, hafnium (IV) n-butoxide, hafnium (IV) t-butoxide, hafnium (IV) ethoxide, hafnium (IV) isopropoxide, hafnium (IV) isopropoxide monoisopropylate, hafnium (IV) acetylacetonate and tetrakis(dimethylamino)hafnium. Examples of the aluminum-based compounds include, but are not limited to, aluminum n-butoxide, aluminum t-butoxide, aluminum s-butoxide, aluminum ethoxide, aluminum isopropoxide, aluminum acetylacetonate, aluminum hexafluoroacetylacetonate, aluminum trifluoroacetylacetonate and tris(2,2,6,6-tetramethyl-3,5-heptanedionato) aluminum.

The nanoparticles of the metal oxide used for the preparation of the first insulating layer include, but are not limited to, nanoparticles of $Ta_2O_5$, $Y_2O_3$, $TiO_2$, $CeO_2$, and $ZrO_2$. The nanoparticles of the metal oxide have preferably a dielectric constant of 5 or higher. The ferroelectric insulator nanoparticles used for the preparation of the first insulating layer include, but are not limited to, nanoparticles of barium strontium titanate (BST), $PbZr_xTi_{1-x}O_3$ (PZT), $Bi_4Ti_3O_{12}$, $BaMgF_4$, $SrBi_2(Ta_{1-x}Nb_x)_2O_9$, $Ba(Zr_{1-x}Ti_x)O_3$ (BZT), $BaTiO_3$, $SrTiO_3$ or $Bi_4Ti_3O_{12}$. The diameters of the nanoparticles are not particularly limited, but preferably range from 1 to 100 nm.

In the OTFT of the present invention, the second insulating layer of the gate insulating film is disposed directly beneath the organic active layer and made of an insulating organic polymer compatible with the organic active layer. Like the first layer, the second layer is formed by the wet process. The organic polymer suitable for the second insulating layer includes polyvinylphenol, polymethylmethacrylate, polyacrylate, polyvinylalcohol, or polymer represented by the following Formula 1:

Formula 1

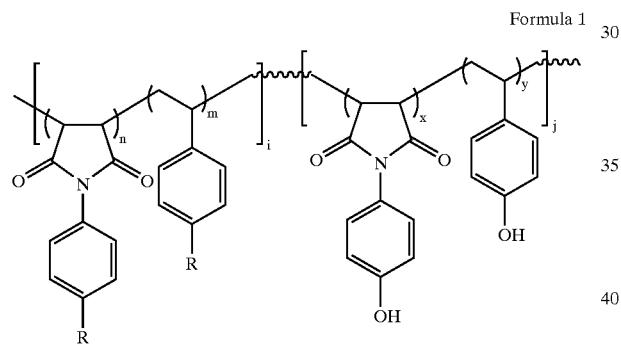

[Wherein, R is represented by the following Formula 2:

Formula 2

(wherein, $R_1$ is selected from the following groups, in which n is an integer of 0 to 10:

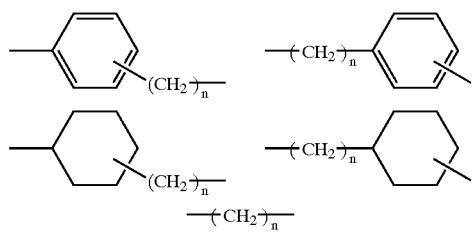

$R_2$ is a photo-alignment group selected from the following (I) and (II), provided that at least one of $R_2$ is selected from (I) when l is 2 or higher:

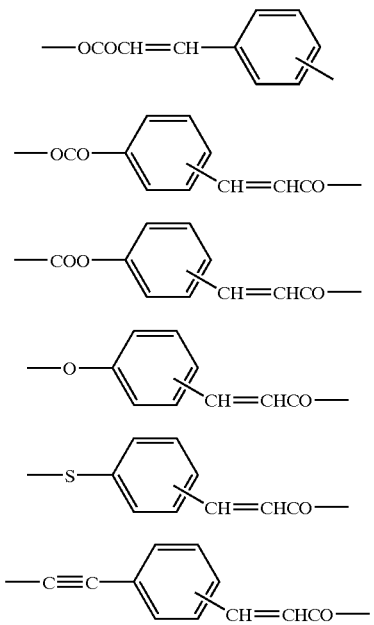

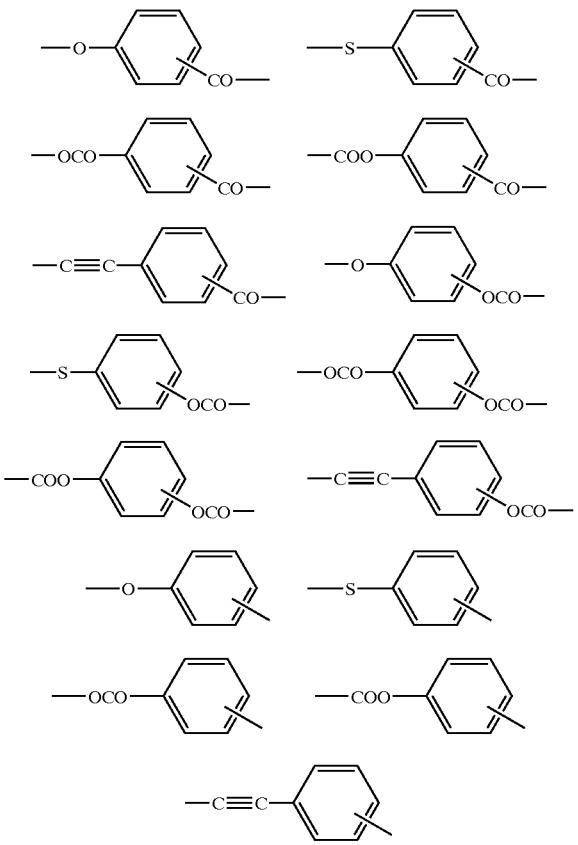

$R_3$ is a hydrogen atom or is selected from among the following groups, in which X is a hydrogen atom, an alkyl or alkoxy group of 1 to 13 carbon atoms, an aromatic group of 6 to 20 carbon atoms, a hetero-aromatic group of 4 to 14 carbon atoms having at least one hetero atom contained in an aromatic ring, —(OCH$_2$)$_p$CH$_3$ (p is an integer of 0 to 12), F or Cl and m is an integer of 0 to 18:

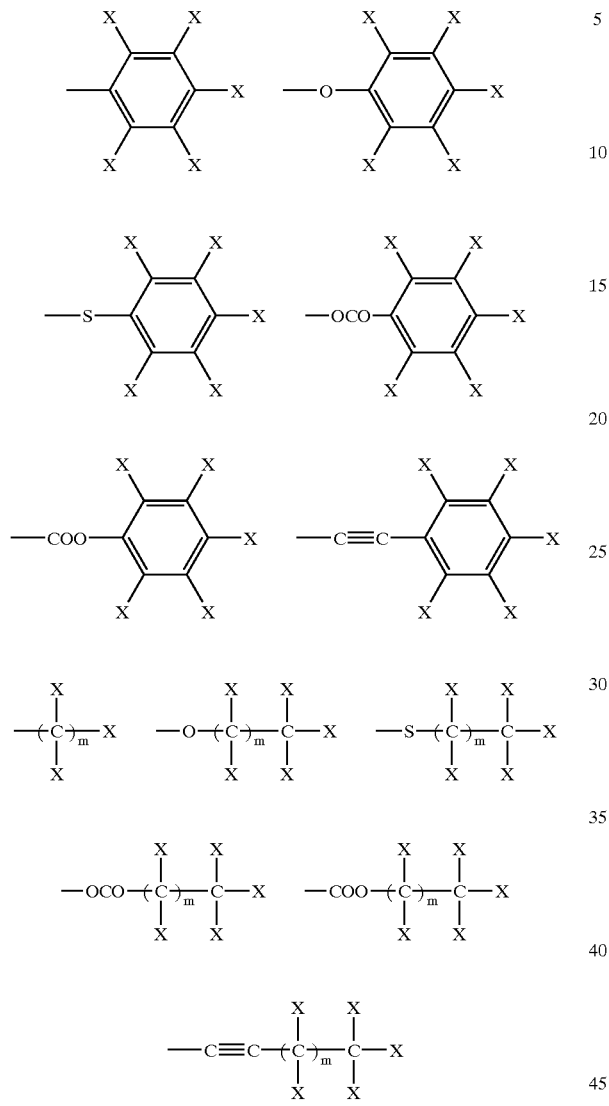

k is an integer of 0 to 3 and l is an integer of 1 to 5, provided that each of R$_1$ and R$_2$ can be different when k or l is 2 or higher);

m is a real number of 0.3 to 0.7, and n is a real number of 0.3 to 0.7, provided that the sum of m and n becomes 1; x is a real number of 0.3 to 0.7, and y is a real number of 0.3 to 0.7, provided that the sum of x and y becomes 1; and i is a real number of 0 to 1 and j is a real number of 0 to 1, provided that the sum of i and j becomes 1].

In the case where a photo-alignment group is introduced to the insulating organic polymer, like polymer of Formula 1, orientation of the organic active layer increases so there can be provided conditions favorable for the formation of the organic active layer and thus a grain size of the active layer can be larger. As a result, the transistor characteristics including the charge mobility between the insulator and the active layer can be enhanced. The preferable examples of the polymer represented by Formula 1 include the ones represented by the following Formulas 3 to 6:

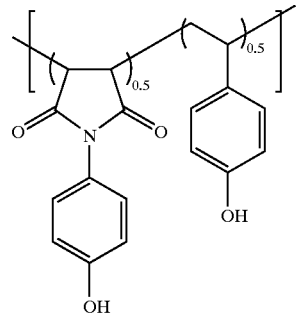

Formula 3

S1

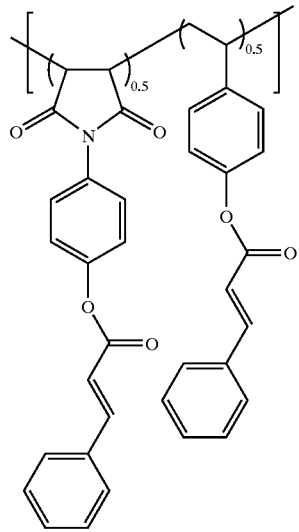

Formula 4

S2

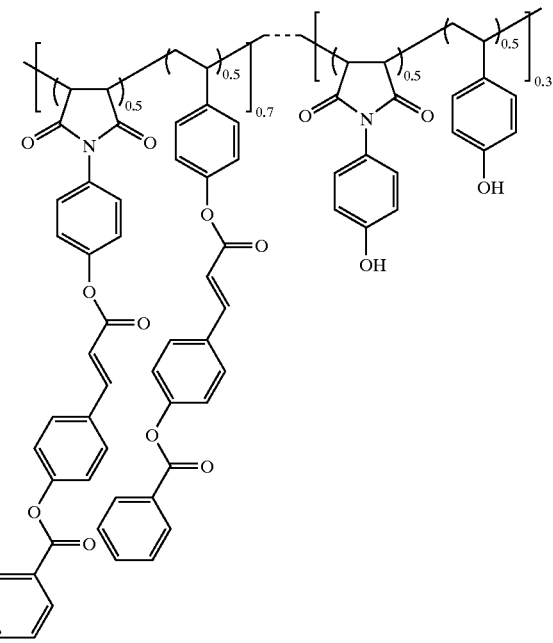

Formula 5

S3

-continued

Formula 6

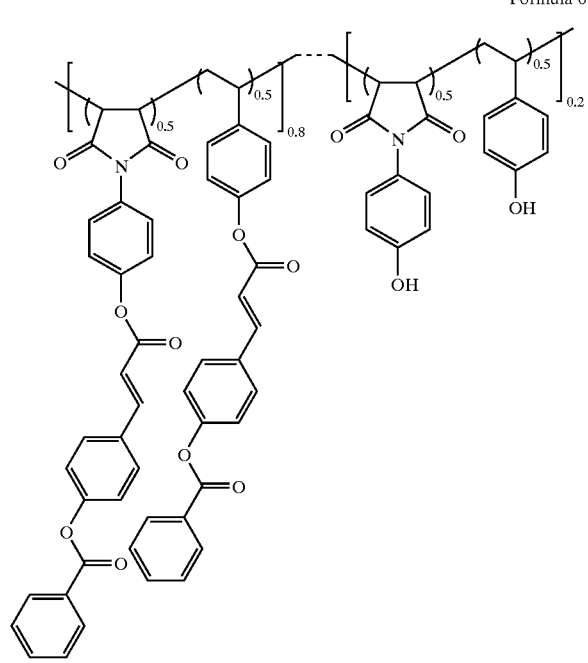

S4

In the OTFT of the present invention, the wet process that can be used to prepare the first or the second layers of the gate insulating film is exemplified by dip coating, spin coating, printing, spray coating, or roll coating techniques, but is not limited thereto.

According to the present invention, not only does the multi-layered gate insulating film have superior insulating properties, but also the OTFT obtained therefrom shows high charge mobility, low driving voltage, low threshold voltage and excellent $I_{on}/I_{off}$ value, compared with the OTFT using the single-layer insulator. In particular, the preparation of the gate insulating film can be achieved by wet process, such as printing or spin coating, while the OTFT produced thereby can rival a TFT of inorganic insulating films prepared by CVD process in its performance.

In the OTFT of the present invention, the organic active layer can be made of any materials known as an organic semiconductor including a conducting polymer. Preferably, the organic active layer is prepared from pentacene, copper phthalocyanine, polythiophene, polyaniline, polyacetylene, polypyrrole, polyphenylene vinylene or derivatives thereof, but is not limited thereto.

In the OTFT of the present invention, materials for the substrate, the gate electrode and the source/drain electrode can be any known materials in the art of the thin film transistor. Preferably, the substrate is made of plastic, glass, quartz, or silicon, and the gate and source/drain electrodes are made of gold (Au), silver (Ag), aluminum (Al), nickel (Ni), indium thin oxide (ITO), but are not limited thereto.

According to the preferable embodiment of the present invention, the OTFT can be prepared by a process comprising the steps of: providing the gate electrode disposed on the substrate and forming a first layer of a high k material, a second layer of an organic insulating polymer compatible with the organic active layer, the organic active layer and the source/drain electrode sequentially, wherein the first and the second layer is disposed through a wet process such as spin coating, the second layer is positioned directly beneath the organic active layer and the layering order between the organic active layer and the source/drain can be reversed.

Hereinafter, the present invention will be described in more detail with reference to the following Examples. However, these examples are provided only for illustrative purposes and are not to be construed as limiting the scope of the present invention.

PREPARATIVE EXAMPLES 1 TO 4

Preparation of First Insulating Layer of High k Material

Polyvinylbutyral (PVB) and tetrabutyl titanate (Ti $(OC_4H_9)_4$) were mixed according to a composition ratio shown in the following Table 1 for each Preparative Example, and the resulting mixture was dissolved in isopropyl alcohol to prepare a 10–20 wt % solution. The solution was coated on an aluminum substrate by spin coating method to form a 2000 Å thick film, which was then thermally cured at 70° C. for 1 hour and then 150° C. for 30 min, thus yielding a first insulating layer. An aluminum substrate was placed on the first insulating layer to manufacture a metal-insulating film-metal structured capacitor. By use of the capacitor, insulating properties were measured at 100 kHz. The results are shown in Table 1, below.

TABLE 1

| Preparative Ex. No. | PVB (wt %) | Ti $(OC_4H_9)_4$ (wt %) | Ti (wt %) | k (dielectric constant) |
| --- | --- | --- | --- | --- |
| 1 | 75 | 25 | 40 | 5.6 |
| 2 | 50 | 50 | 66 | 15 |
| 3 | 30 | 70 | 82 | 27 |
| 4 | 10 | 90 | 95 | 30 |

From the above table, it can be seen that a dielectric constant can increase up to 30 by controlling the amount of titanate.

EXAMPLE 1

On a glass substrate having a gate electrode made of aluminum, a first insulating layer was formed in the same manner as in Preparative Example 2. A cyclohexanone solution (100 wt %) of a polymer (S1) represented by Formula 3 was prepared, and spin-coated on the first insulating layer to form a 5000 Å thick film, which was then baked at 100° C. for 1 hour in a nitrogen atmosphere, to prepare a two-layered gate insulating film having a total thickness of 700 nm. Then, a 700 Å thick pentacene organic active layer was formed on the gate insulating film by using an OMBD (Organic Molecular Beam Deposition) process, which is performed under $2 \times 10^{-6}$ torr with a deposition rate of 0.3 Å/sec while maintaining a substrate temperature at 80° C. On the active layer thus obtained, a source/drain electrode was formed by a top contact method using a shadow mask having a channel length of 100 μm and a channel width of 1 mm, thereby fabricating an OTFT. For the OTFT thus obtained, a dielectric constant per unit area ($C_0$: nF/unit area), threshold voltage, $I_{on}/I_{off}$ value and charge mobility were measured in accordance with the following procedures. The results are shown in Table 2 below.

(1) Dielectric Constant Per Unit Area, $C_0$

A dielectric constant showing dielectric properties was determined by the following equation:

$$C_0 = \epsilon/\epsilon_0 (A/d)$$

(wherein, A denotes an area of the device; d denotes a thickness of a dielectric; and $\epsilon$ and $\epsilon_0$ denotes a dielectric constant of the dielectric and vacuum, respectively).

(2) Charge Mobility and Threshold Voltage

The charge mobility was determined from the following current equation of saturation region. That is, after obtaining a plot of the square root of the source-drain current $[(I_{SD})^{1/2}]$ as a function of gate voltage $(V_G)$, the charge mobility $(\mu_{FET})$ was calculated from a slope of the plot referring to the following equations:

$$I_{SD} = \frac{WC_0}{2L}\mu(V_G - V_T)^2$$

$$\sqrt{I_{SD}} = \sqrt{\frac{\mu C_0 W}{2L}}(V_G - V_T)$$

$$\text{slope} = \sqrt{\frac{\mu C_0 W}{2L}}$$

$$\mu_{FET} = (\text{slope})^2 \times \frac{2L}{C_0 W}$$

(wherein, $I_{SD}$ denotes a source-drain current; $\mu$ or $\mu_{FET}$ denotes a charge mobility; $C_o$ denotes capacitance per unit area; W denotes a channel width; L denotes a channel length; and, $V_G$ and $V_T$ denote a gate voltage and a threshold voltage, respectively).

The threshold voltage $(V_T)$ was determined from an intersection point between a $V_G$ axis and an extension line of linear portion of the plot of $(I_{SD})^{1/2}$ and $V_G$. The smaller absolute value of the threshold voltage that are close to 0 means the smaller consumption in the electric power.

(3) $I_{on}/I_{off}$ Value $I_{on}/I_{off}$ value can be determined from a ratio of a maximum current in the on-state to a minimum current in the off-state and it satisfies the following equation:

$$\frac{I_{on}}{I_{off}} = \left(\frac{\mu}{\sigma}\right)\frac{C_0^2}{qN_A t^2}V_D^2$$

(wherein, $I_{on}$ is a maximum current value; $I_{off}$ is an off-state leakage current; $\mu$ is a charge mobility; $\sigma$ is a conductivity of a thin film; q is a charge amount; $N_A$ is a charge density; t is a thickness of a semiconductor film; $C_0$ is an oxidation film capacity; and $V_D$ is a drain voltage).

As a dielectric constant of the dielectric film is higher and a thickness thereof is thinner, $I_{on}/I_{off}$ becomes large. Thus, the kinds and thickness of the dielectric film can be an important factor determining $I_{on}/I_{off}$ value. The off-state leakage current, $I_{off}$ is a current flowing in the off-state and can be determined as a minimum current in the off-state.

Figure 2:
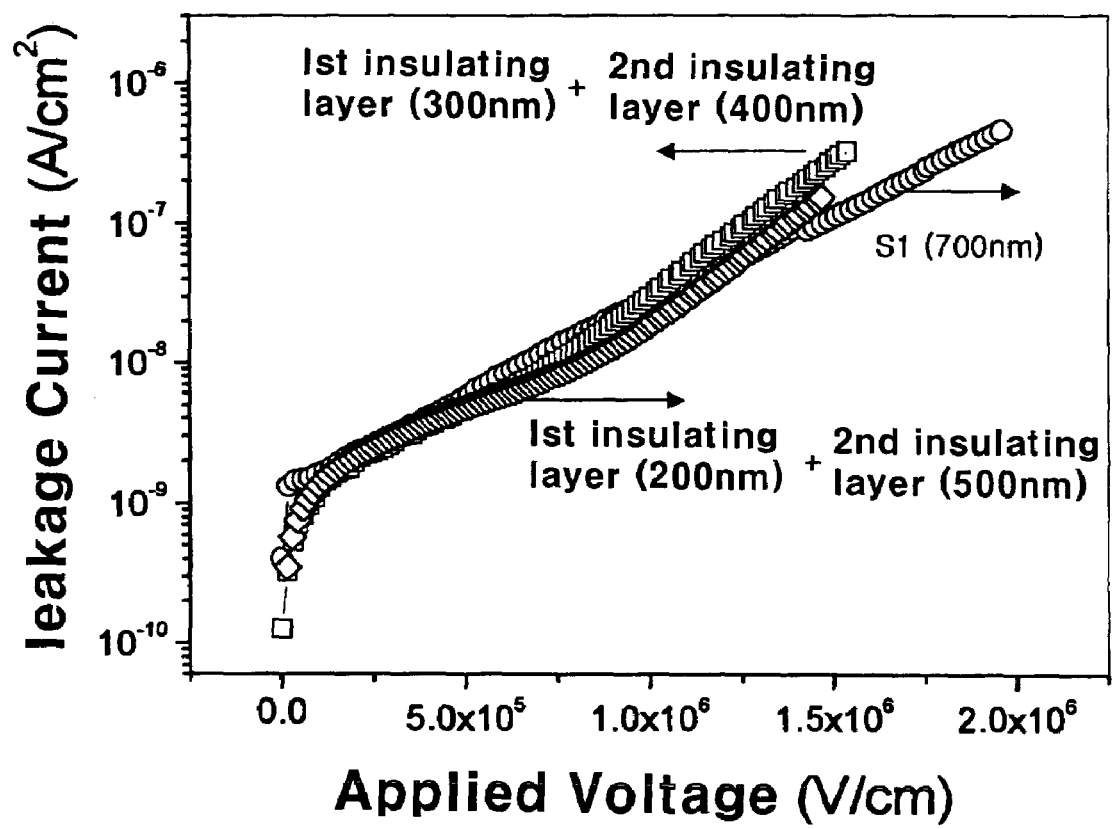
FIG. 2 is a plot showing the change of leakage current as varying the applied voltage to the OTFT's prepared in Examples 1 and 3 and Comparative Example 1.
Figure 3:
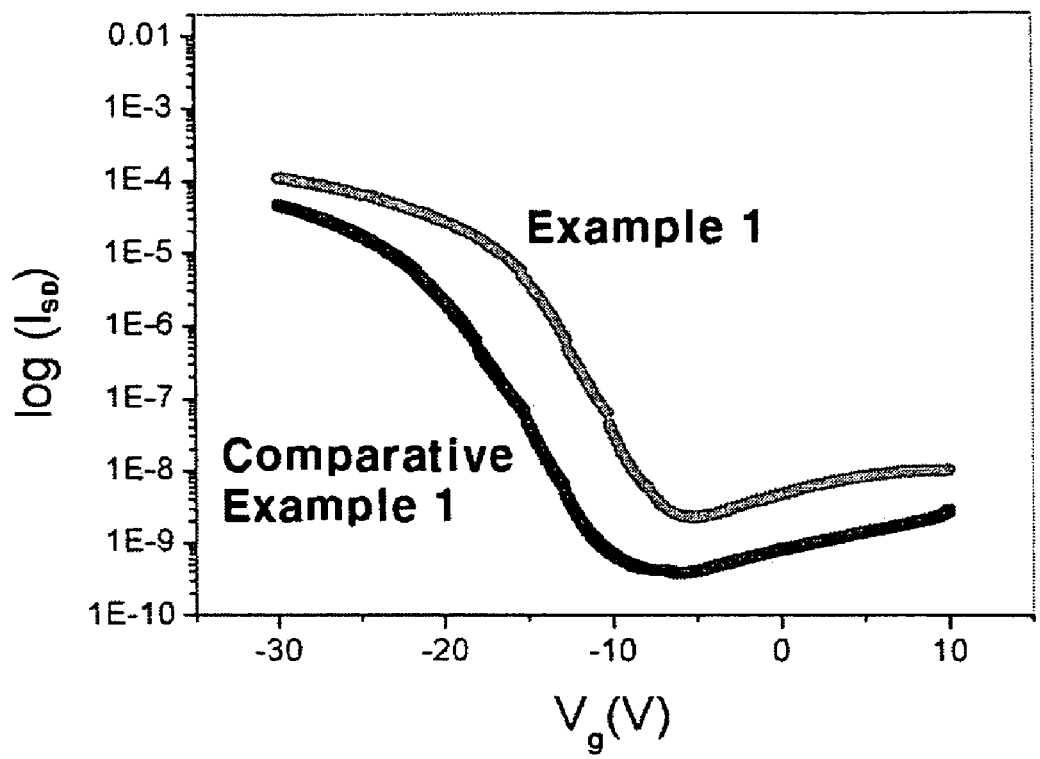
In FIG. 3 are shown the measured operating characteristics of the OTFTs prepared in Example 1 and Comparative Example 1 respectively, by a plot of the drain current as a function of the gate voltage; and In FIG. 4 are shown plots of the square root of the drain current as a function of gate voltage of prepared in Example 1 and Comparative Example 1 and, from the plots, threshold voltages of the OFTF can be obtained.
Figure 4:
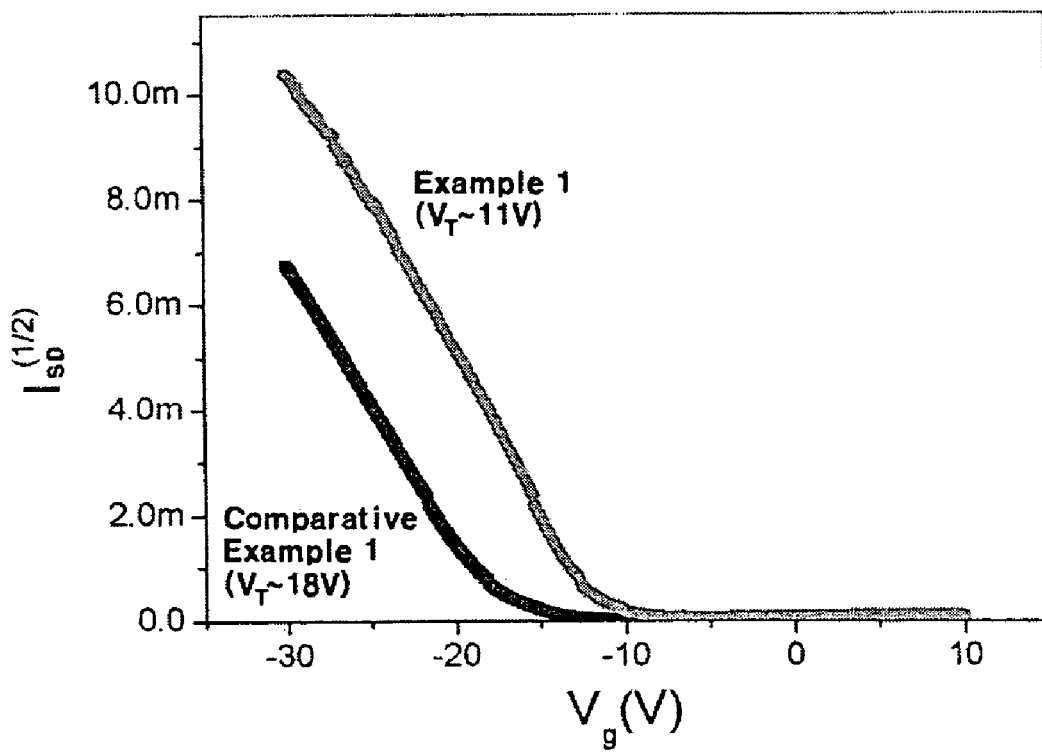

FIG. 2 shows the change of a leakage current while varying the applied voltage to the OTFT. From FIG. 3 showing the change of $I_{SD}$ to $V_G$, it can be seen that when the gate insulating film of the present invention was used, a curve was shifted to be close to 0, which means a lower threshold voltage. Also, from the plot of $(I_{SD})^{1/2}$ and $V_G$ shown in FIG. 4, it can be seen that the threshold voltage of the OTFT in the present invention decreased to 50% or more.

EXAMPLE 2

An OTFT was prepared in the same manner as in Example 1, with the exception that the first insulating layer was formed using the composition and the solvent under the conditions same as in Preparative Example 3. For the OTFT, a dielectric constant per unit area ($C_0$: nF/unit area), threshold voltage, $I_{on}/I_{off}$ value, and charge mobility were measured in accordance with the same procedures as Example 1. The results are shown in Table 2 below.

EXAMPLE 3

An OTFT was prepared in the same manner as in Example 1, with the exception that a 300 nm-thick first layer and a 400 nm-thick second layer were adopted. For the OTFT, a dielectric constant per unit area ($C_0$: nF/unit area), threshold voltage, $I_{on}/I_{off}$ value, and charge mobility were measured in accordance with the same procedures as Example 1. The results are shown in Table 2 below.

COMPARATIVE EXAMPLE 1

An OTFT was prepared in the same manner as in Example 1, with the exception of using a single-layer gate insulating film obtained from a cyclohexanone solution (10 wt %) of S1, which was then spin-coated at a thickness of 7000 Å and then baked at 100° C. for 1 hour in a nitrogen atmosphere, instead of the multi-layered gate insulating film. For the OTFT, a dielectric constant per unit area (Co: nF/unit area), threshold voltage, $I_{on}/I_{off}$ value, and charge mobility were measured in accordance with the same procedures as Example 1. The results are shown in Table 2 below.

EXAMPLE 4

An OTFT was prepared in the same manner as in Example 1, with the exception of using as the second insulating layer PVP (polyvinylphenol) film prepared by dissolving PVP in PGMEA (Propylene Glycol Methyl Ether Acetate) to obtain a 15 wt % solution, which was then spin-coated at a thickness of 5000 Å and then baked at 100° C. for 1 hour in a nitrogen atmosphere. For the OTFT, a dielectric constant per unit area ($C_0$: nF/unit area), threshold voltage, $I_{on}/I_{off}$ value, and charge mobility were measured in accordance with the same procedures as Example 1. The results are shown in Table 2 below.

COMPARATIVE EXAMPLE 2

An OTFT was prepared in the same manner as in Example 1, with the exception of using a single layer gate insulating film obtained by dissolving PVP in PGMEA to obtain a 15 wt % solution, which was then spin-coated at a thickness of 5000 Å and then baked at 100° C. for 1 hour in a nitrogen atmosphere, instead of the multi-layered gate insulating film. For the OTFT, a dielectric constant per unit area ($C_0$: nF/unit area), threshold voltage, $I_{on}/I_{off}$ value, and charge mobility were measured in accordance with the same procedures as Example 1. The results are shown in Table 2 below.

TABLE 2

| Ex. No. | 1st Insulating Layer | 2nd Insulating Layer | $C_0$ (nF/unit area) | Threshold Voltage (V) | $I_{on}/I_{off}$ | Charge Mobility |
|---|---|---|---|---|---|---|
| 1 | PVB:Ti(OC$_4$H$_9$)$_4$ 50:50(200 nm) | S1 (500 nm) | 7.0 | −11 | $1.02 \times 10^4$ | 3–5 |
| 2 | PVB:Ti(OC$_4$H$_9$)$_4$ 30:70(200 nm) | S1 (500 nm) | 7.9 | −9 | $1.02 \times 10^4$ | 3–5 |
| 3 | PVB:Ti(OC$_4$H$_9$)$_4$ 50:50(300 nm) | S1 (400 nm) | 8.6 | −7 | $7.76 \times 10^3$ | 3–5 |
| 4 | PVB:Ti(OC$_4$H$_9$)$_4$ 50:50(200 nm) | PVP (500 nm) | 7.3 | −13 | $1.24 \times 10^5$ | 6 |
| C. 1 | — | S1 (700 nm) | 5.9 | −15 | $6.67 \times 10^3$ | 3–5 |
| C. 2 | — | PVP (700 nm) | 5.5 | −17 | $0.71 \times 10^5$ | 6 |

From the above table, it can be seen that the OTFT of the present invention has high charge mobility, high $I_{on}/I_{off}$, low driving voltage, and low threshold voltage, with superior electrical insulating properties. Thus, the OTFT of the present invention can be effectively applied as a transistor in various electronic devices.

As described above, according to the present invention, there is provided an organic thin film transistor comprising a multi-layered gate insulating film, which exhibits advantageously low driving and threshold voltages, high charge mobility and high $I_{on}/I_{off}$. Further, the insulating film of the present invention can facilitate the formation of the organic active layer and as well, it can be formed by a wet process, thus simplifying a preparation process and decreasing preparation costs. The OTFT of the present invention can be usefully applied in flexible display fields.

The present invention has been described in an illustrative manner, and it should be understood that the terminology used is intended to be in the nature of description rather than of limitation. Many modifications and variations of the present invention are possible in light of the above teachings. Therefore, it should be understood that within the scope of the appended claims, the invention may be practiced otherwise than as specifically described.

What is claimed is:

1. An organic thin film transistor, comprising a gate electrode, a gate insulating film, an organic active layer and a source/drain electrode, or a gate electrode, a gate insulating film, a source/drain electrode and an organic active layer, sequentially located on a substrate,
   wherein the gate insulating film is a multi-layered insulator comprising a first layer of a high k material and a second layer of an insulating organic polymer compatible with the organic active layer, the second layer being positioned directly under the organic active layer,
   wherein the insulating organic polymer of the second insulating layer is selected from the group consisting of polyvinylphenol, polyacrylate, polyvinylalcohol, and a polymer represented by the following Formula 1:

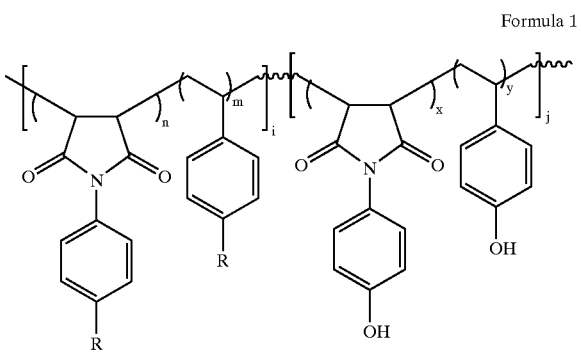

Formula 1 wherein, R is represented by the following Formula 2:

Formula 2 wherein $R_1$ is selected from the group consisting of the following groups of group A, in which n is an integer of 0 to 10:

Group A

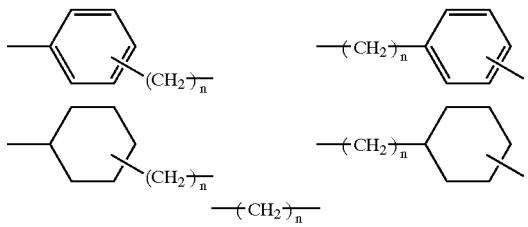

$R_2$ is a photo-alignment group selected from the group consisting of the following groups of Group B, provided that at least one of $R_2$ is selected from (I) when I is 2 or higher:

Group B

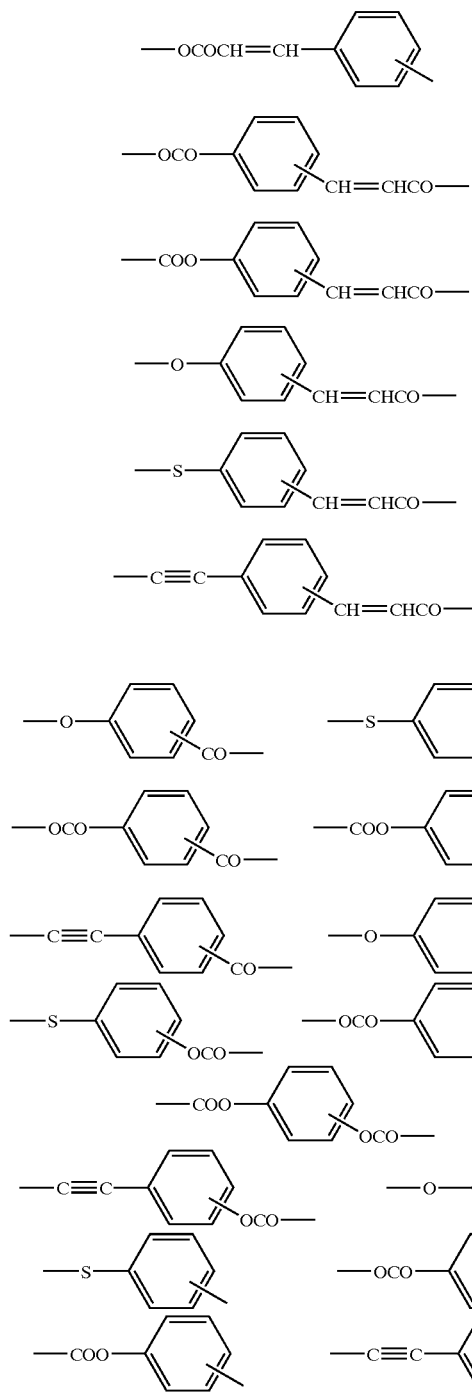

$R_3$ is a hydrogen atom or is selected from the group consisting of the following groups of Group C, in which X is a hydrogen atom, an alkyl or alkoxy group of 1 to 13 carbon atoms, an aromatic group of 6 to 20 carbon atoms, a hetero-aromatic group of 4 to 14 carbon atoms having at least one hetero atom contained in an aromatic ring, —(OCH$_2$)$_p$CH$_3$ wherein p is an integer of 0 to 12, F or Cl and m is an integer of 0 to 18:

Group C

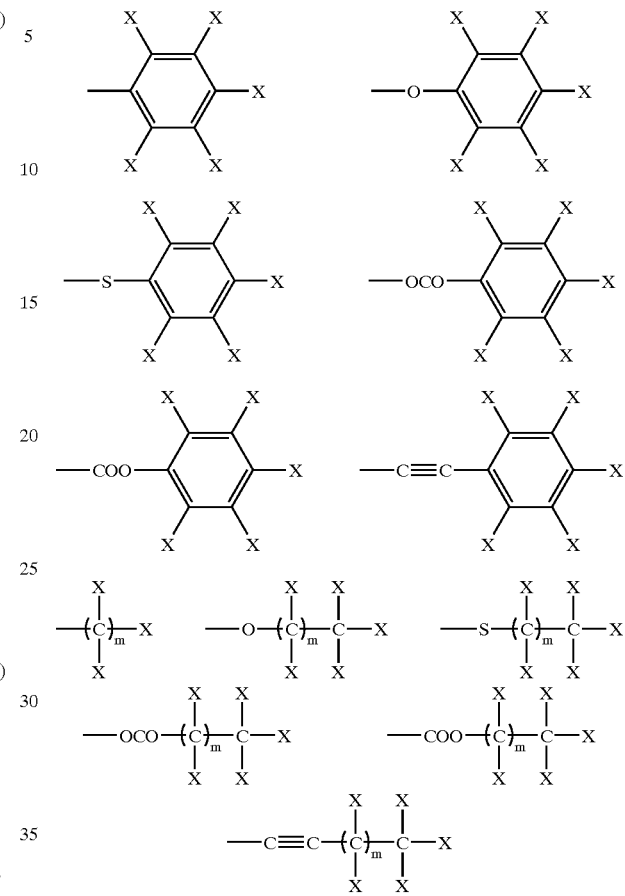

k is an integer of 0 to 3 and l is an integer of 1 to 5, provided that each of $R_1$ and $R_2$ can be different when k or l is 2 or higher;

m is a real number of 0.3 to 0.7, and n is a real number of 0.3 to 0.7, provided that the sum of m and n becomes 1; x is a real number of 0.3 to 0.7, and y is a real number of 0.3 to 0.7, provided that the sum of x and y becomes 1; and i is a real number of 0 to 1 and j is a real number of 0 to 1, provided that the sum of i and j becomes 1.

2. The organic thin film transistor of claim 1, wherein the polymer represented by the Formula 1 is a compound represented by the following Formulas 3, 4, 5, or 6:

Formula 3

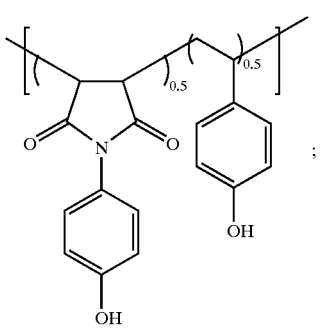

Formula 3

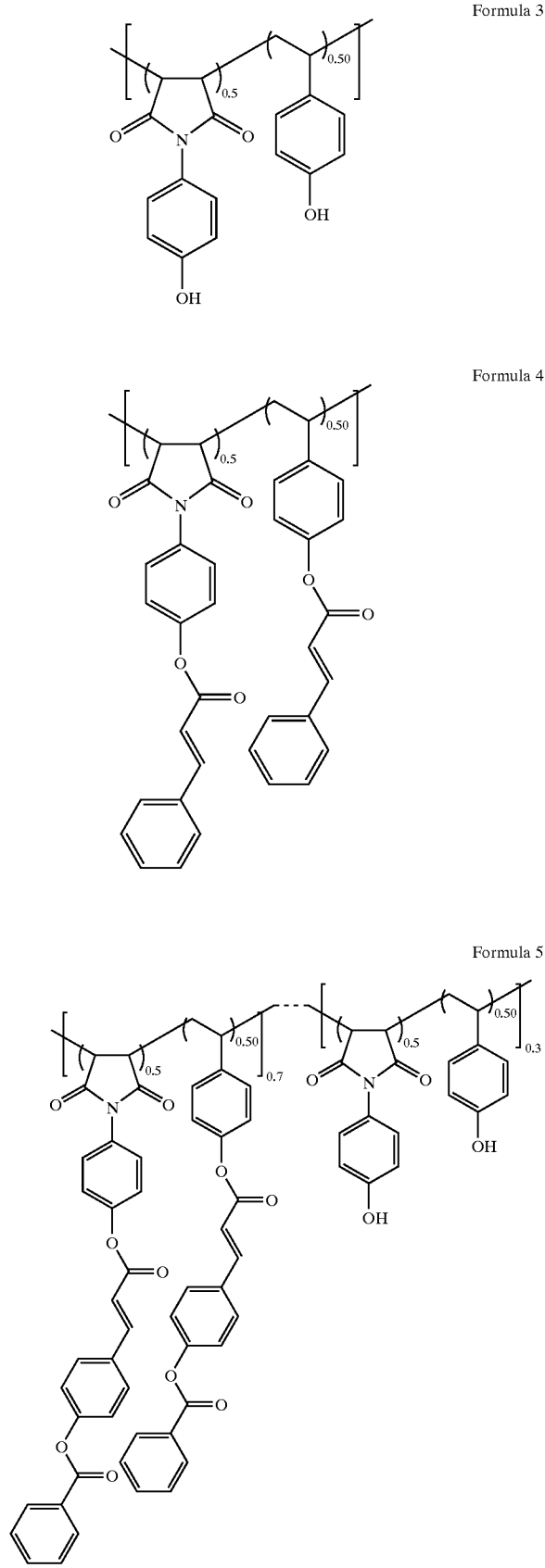

Formula 4

Formula 5

-continued

Formula 6

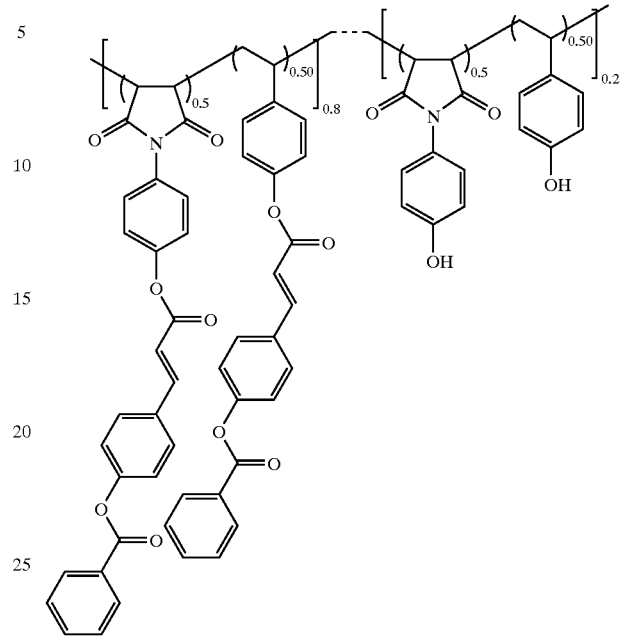

3. The organic thin film transistor of claim 1, wherein the first and the second layers of the gate insulating film are formed by a wet process.

4. The organic thin film transistor of claim 1, wherein the substrate is plastic, glass, quartz, or silicon substrate.

5. The organic thin film transistor of claim 3, wherein the wet process is carried out by a spin coating, a dip coating, a printing, or a roll coating method.

6. The organic thin film transistor of claim 1, wherein the organic active layer is made of any one selected from the group consisting of pentacene, copper phthalocyanine, polythiophene, polyaniline, polyacetylene, polypyrrole, polyphenylene vinylene, and derivatives thereof.

7. The organic thin film transistor of claim 1, wherein the high k material for the first insulating layer is a mixture of an insulating organic polymer and an organic metal compound, or a mixture of an insulating organic polymer and nanoparticles of an inorganic metal oxide or a ferroelectric insulator, wherein the high k material has a dielectric constant (k) of 5 or higher.

8. The organic thin film transistor of claim 7, wherein the insulating organic polymer for the first layer is selected from the group consisting of polyester, polycarbonate, polyvinylalcohol, polyvinylbutyral, polyacetal, polyarylate, polyamide, polyamidimide, polyetherimide, polyphenylenether, polyphenylenesulfide, polyethersulfone, polyetherketone, polyphthalamide, polyethernitrile, polyethersulfone, polybenzimidazole, polycarbodiimide, polysiloxane, polymethylmethacrylate, polymethacrylamide, nitrile rubbers, acryl rubbers, polyethylenetetrafluoride, epoxy resins, phenol resins, melamine resins, urea resins, polybutene, polypentene, ethylene-co-propylene, ethylene-co-butene diene, polybutadiene, polyisoprene, ethylene-co-propylene diene, butyl rubbers, polymethylpentene, polystyrene, styrene-co-butadiene, hydrogenated styrene-co-butadiene, hydrogenated polyisoprene, hydrogenated polybutadiene, and mixtures thereof.

9. The organic thin film transistor as defined in claim 7, wherein the organic metal compound for the first layer is selected from the group consisting of titanium-based compounds, including titanium (IV) n-butoxide, titanium (IV) t-butoxide, titanium (IV) ethoxide, titanium (IV) 2-ethylhexoxide, titanium (IV) isopropoxide, titanium (IV) (di-isopropoxide)bis-(acetylacetonate), titanium (IV) oxide bis (acetylacetonate), trichlorotris(tetrahydrofuran)titanium (III), tris(2,2,6,6-tetramethyl-3,5-heptanedionato)titanium (III), (trimethyl)pentamethyl cyclopentadienyl titanium (IV), pentamethylcyclopentadienyltitanium trichloride (IV), pentamethylcyclopentadienyltitanium trimethoxide (IV), tetrachlorobis(cyclohexylmercapto)titanium (IV), tetrachlorobis(tetrahydrofuran)titanium (IV), tetrachlorodiamminetitanium (IV), tetrakis(diethylamino)titanium (IV), tetrakis(dimethylamino)titanium (IV), bis(t-butylcyclopentadienyl) titanium dichloride, bis(cyclopentadienyl)dicarbonyl titanium (II), bis(cyclopentadienyl)titanium dichloride, bis (ethylcyclopentadienyl)titanium dichloride, bis(pentamethylcyclopentadienyl)titanium dichloride, bis(isopropylcyclopentadienyl)titanium dichloride, tris(2,2,6,6-tetramethyl-3,5-heptanedionato)oxotitanium (IV), chlorotitanium triisopropoxide, cyclopentadienyltitanium trichloride, dichlorobis(2,2,6,6-tetramethyl-3,5-heptane dionato) titanium (IV), dimethylbis(t-butylcyclopentadienyl)titanium (IV), or di(isopropoxide)bis (2,2,6,6-tetramethyl-3,5-heptanedionato)titanium (IV); zirconium- or hafnium-based compounds, including zirconium (IV) n-butoxide, zirconium (IV) t-butoxide, zirconium (IV) ethoxide, zirconium (IV) isopropoxide, zirconium (IV) n-propoxide, zirconium (IV) acetylacetonate, zirconium (IV) hexafluoroacetylacetonate, zirconium (IV) trifluoroacetylacetonate, tetrakis(diethylamino)zirconium, tetrakis(dimethylamino)zirconium, tetrakis(2,2,6,6-tetramethyl-3,5-heptanedionato)zirconium (IV), zirconium (IV) sulfate tetrahydrate, hafnium (IV) n-butoxide, hafnium (IV) t-butoxide, hafnium (IV) ethoxide, hafnium (IV) isopropoxide, hafnium (IV) isopropoxide monoisopropylate, hafnium (IV) acetylacetonate, or tetrakis (dimethylamino)hafnium; aluminum-based compounds, including aluminum n-butoxide, aluminum t-butoxide, aluminum s-butoxide, aluminum ethoxide, aluminum isopropoxide, aluminum acetylacetonate, aluminum hexafluoroacetylacetonate, aluminum trifluoroacetylacetonate, or tris (2,2,6,6-tetramethyl-3,5-heptanedionato) aluminum; and mixtures thereof.

10. The organic thin film transistor as defined in claim 7, wherein the nanoparticles of the inorganic metal oxide comprise nanoparticles of $Ta_2O_5$, $Y_2O_3$, $TiO_2$, $CeO_2$, or $ZrO_2$, and the nanoparticles of the ferroelectric insulator comprise nanoparticles of barium strontium titanate (BST), $PbZr_xTi_{1-x}O_3$ (PZT), $Bi_4Ti_3O_{12}$, $BaMgF_4$, $SrBi_2(Ta_{1-x}Nb_x)_2O_9$, $Ba(Zr_{1-x}Ti_x)O_3$ (BZT), $BaTiO_3$, $SrTiO_3$ or $Bi_4Ti_3O_{12}$, in which the nanoparticles have diameters of 1–100 nm.

* * * * *